US012672491B2

(12) United States Patent (10) Patent No.: US 12,672,491 B2
Wang et al. (45) Date of Patent: Jun. 30, 2026

(54) DEPOSITION OF SILICON NITRIDE WITH ENHANCED SELECTIVITY

(71) Applicant: ENTEGRIS, INC., Billerica, MA (US)

(72) Inventors: Han Wang, Hillsboro, OR (US); Bryan Clark Hendrix, Danbury, CT (US); Eric Condo, Shelton, CT (US)

(73) Assignee: ENTEGRIS, INC., Billerica, MA (US)

( * ) Notice: Subject to any disclaimer, the term of this patent is extended or adjusted under 35 U.S.C. 154(b) by 516 days.

(21) Appl. No.: 18/079,318

(22) Filed: Dec. 12, 2022

(65) Prior Publication Data

US 2023/0187202 A1 Jun. 15, 2023

Related U.S. Application Data

(60) Provisional application No. 63/289,714, filed on Dec. 15, 2021.

(51) Int. Cl.
| | |
|---|---|
| *H01L 21/02* | (2006.01) |
| *C23C 16/34* | (2006.01) |
| *C23C 16/455* | (2006.01) |
| *C23C 16/50* | (2006.01) |

(52) U.S. Cl.
CPC ...... *H01L 21/02208* (2013.01); *C23C 16/345* (2013.01); *C23C 16/4554* (2013.01); *C23C 16/50* (2013.01); *H01L 21/0217* (2013.01); *H01L 21/02274* (2013.01); *H01L 21/0228* (2013.01); *H01L 21/02315* (2013.01)

(58) Field of Classification Search
None
See application file for complete search history.

(56) References Cited

U.S. PATENT DOCUMENTS

| | | | |
|---|---|---|---|
| 6,225,236 B1 | 5/2001 | Nishimoto et al. | |
| 9,601,693 B1 | 3/2017 | Henri et al. | |
| 2015/0259791 A1 | 9/2015 | Hausmann et al. | |
| 2016/0148800 A1 | 5/2016 | Henri et al. | |
| 2018/0323055 A1 | 11/2018 | Woodruff et al. | |
| 2018/0323056 A1* | 11/2018 | Woodruff | H01L 21/0234 |
| 2019/0330736 A1 | 10/2019 | Wang et al. | |
| 2020/0035486 A1 | 1/2020 | Venkatasubramanian et al. | |
| 2020/0266048 A1 | 8/2020 | Wang et al. | |

(Continued)

OTHER PUBLICATIONS

Mikhaylichenko, Post CMP Cleans Evolution and Defect Improvement Approaches, Presented by Applied Materials at Business of Cleans / SPCC Conference 2018 (31 pages).

(Continued)

*Primary Examiner* — Asok K Sarkar

(57) ABSTRACT

The use of selective deposition of silicon nitride can eliminate conventional patterning steps by allowing silicon nitride to be deposited only in selected and desired areas. Using a silicon iodide precursor alternately with a thermal nitrogen source in an ALD or pulsed CVD mode, silicon nitride can be deposited preferentially on a surface such as silicon nitride, silicon dioxide, germanium oxide, SiCO, SiOF, silicon carbide, silicon oxynitride, and low k substrates, while exhibiting very little deposition on exposed surfaces such as titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, and strontium oxide.

19 Claims, 4 Drawing Sheets

(56)             References Cited

U.S. PATENT DOCUMENTS

2020/0286726 A1      9/2020   Shero
2021/0225643 A1*     7/2021   Kuroda ............ H01L 21/02211

OTHER PUBLICATIONS

Wang et al., Selective ALD of SiN using Sil4 and NH3: The effect
of temperature, plasma treatment, and oxide underlayer, J. Vac. Sci.
Technol. A 38, 062410 (2020); https://doi.org/10.1116/6.0000538.

* cited by examiner

DEPOSITION OF SILICON NITRIDE WITH ENHANCED SELECTIVITY

PRIORITY CLAIM

The invention claims priority to U.S. provisional patent No. 63/289,714 with a filing date of Dec. 15, 2021, which is incorporated by reference herein.

TECHNICAL FIELD

The invention relates to a process for the selective deposition of silicon nitride onto certain surfaces of microelectronic devices.

BACKGROUND

Silicon nitride is commonly used in the fabrication of integrated circuits. For example, it is often used as an insulating material in the manufacturing of various microelectronic devices such as memory cells, logic devices, memory arrays, etc. Traditionally, silicon nitride films are deposited over the entire substrate surface, while the deposition may be needed only in certain areas. As a result, additional lithography and etch steps are utilized to remove any unwanted regions. It is highly desirable to reduce the number of lithography and etch steps involved, as a means for reducing the overall cost of fabrication. In addition, if the silicon nitride is selectively deposited only where it is needed, then errors in lithography do not affect the definition of the coated area. Thus, it would be desirable to achieve a silicon nitride deposition where such selectivity is enhanced.

SUMMARY

The use of selective deposition of silicon nitride can eliminate conventional patterning steps by allowing silicon nitride to be deposited only in selected and desired areas. Using a silicon iodide precursor alternately with a thermal nitrogen source in an ALD or pulsed CVD mode, silicon nitride can be deposited preferentially on a surface such as silicon nitride, silicon dioxide, germanium oxide, SiCO, SiC, SiON, SiOF, and low-k substrates, while exhibiting very little deposition on other exposed surfaces such as titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, and strontium oxide.

In addition, by both (i) pre-treating these surfaces with ammonia plasma, while in conjunction (ii) directly treating the substrate in the reaction zone with additional regime(s) of ammonia plasma on a periodic basis, the selectivity can be maintained throughout the bulk deposition of the silicon nitride, while also improving the refractive index of the resulting film.

BRIEF DESCRIPTION OF THE DRAWINGS

In FIG. 4a, the desired result is the deposition of silicon nitride in a well, while minimizing deposition on the aluminum oxide side walls, and thus results in a "filling". FIG. 4b illustrates the opposite challenge, i.e., the deposition on silicon dioxide side walls while not depositing silicon nitride on the aluminum oxide bottom.

DETAILED DESCRIPTION

Figure 1:
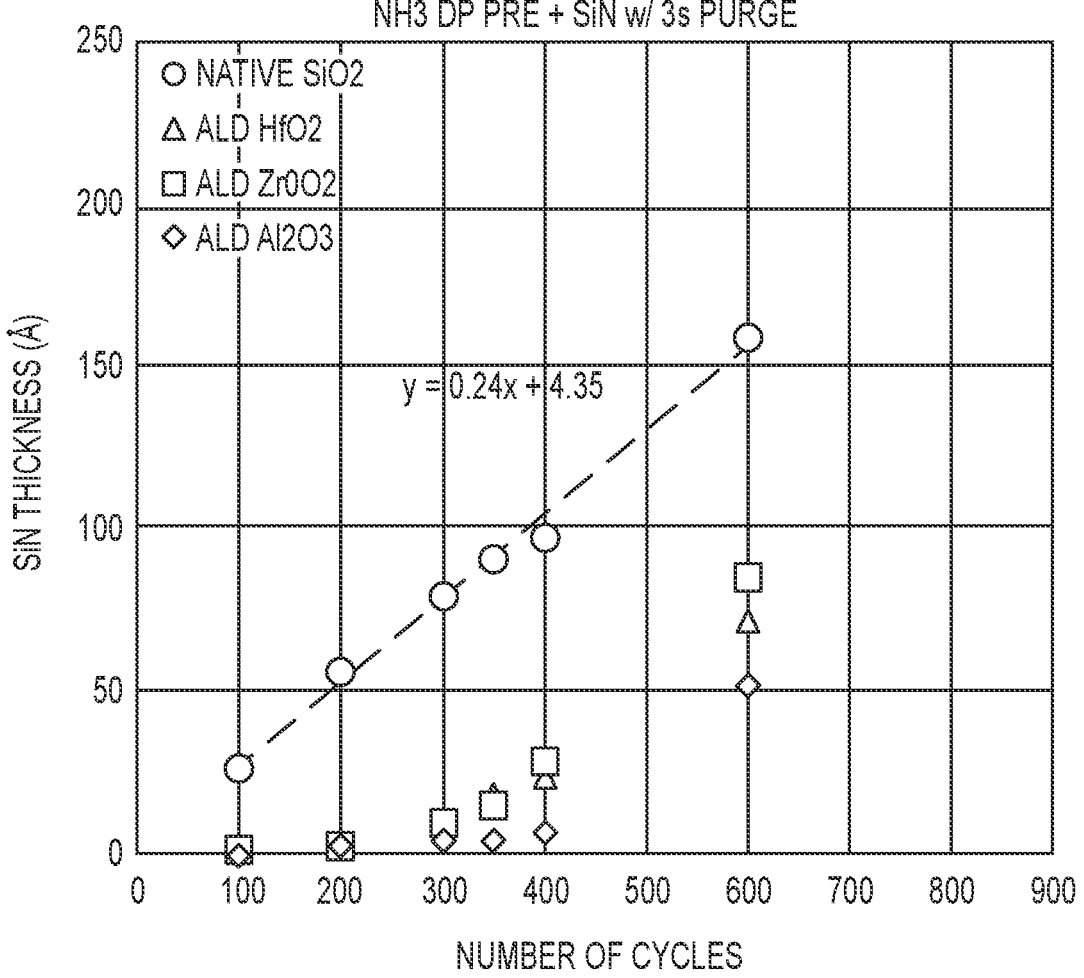
FIG. 1 (comparative) is a plot of silicon nitride thickness in angstroms versus number of cycles for the known process where direct ammonia plasma is applied to the substrate in a reaction zone, followed by silicon tetraiodide and ammonia thermal atomic layer deposition. From this plot, it can be observed that while initially the process is selective for deposition on a silicon dioxide surface, such selectivity begins to diminish after about 100 angstroms (10 nm).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In a first aspect, the invention provides a process for depositing silicon nitride on a microelectronic device substrate having a plurality of surfaces of differing composition, which comprises a. contacting the substrate with pulsed silicon tetraiodide or disilicon hexaiodide, and nitrogen-containing co-reactants, at a temperature of about 150° C. to about 400° C., at a pressure below about 15 Torr, under vapor deposition conditions, thereby defining a pulse cycle, and b. wherein the substrate is (i) pre-treated with ammonia plasma, and wherein (ii) the substrate is further treated with ammonia plasma periodically thereafter.

The present invention provides a process for the selective vapor deposition of silicon nitride layers onto various microelectronic device substrates. In general terms, the invention enables the selective deposition of silicon nitride films onto microelectronic device substrates having silicon, silicon oxide, and/or silicon nitride surfaces, over and in the presence of surfaces comprised of higher-k dielectrics, metal, and metal nitride surfaces. As noted above, step b(ii) involves the periodic treatment with ammonia plasma. By "periodic" it is meant that the ammonia plasma treatment does not occur after each pulse cycle of silicon tetraiodide ($SiI_4$) or disilicon hexaiodide ($Si_2I_6$) and nitrogen-containing co-reactant.

In certain embodiments, the vapor deposition of the invention is atomic layer deposition (ALD). For the purposes herein, ALD is referred to as a chemical vapor deposition mode where various reactants and co-reactants are separated in space or time, such that a substrate is exposed alternatively to one reactant separately from the co-reactant. In other embodiments, the vapor deposition of the invention is Spatial ALD where film growth is achieved by exposing the substrate to locations containing different precursors. In other embodiments, the vapor deposition conditions comprise pulsed chemical vapor deposition (Pulsed CVD) conditions, whereby a first reactant such as silicon tetraiodide or silicon hexaiodide is continuously introduced into a reaction zone containing the microelectronic device substrate along with pulsed exposures of the substrate to ammonia, each set of pulses defining a cycle, with an initial pre-treatment of the substrate with ammonia plasma. Additional pulses of ammonia plasma are introduced into the reaction zone after a chosen number of cycles. In both the ALD and Pulsed CVD regimes, this periodic introduction of ammonia plasma into the reaction zone is effected after two or more cycles of silicon tetraiodide (or silicon hexaiodide) and ammonia pulses. In certain embodiments, ammonia plasma is introduced periodically after 3, 5, 10, 50, 100, 150, 200, or 1000 of such cycles, or after any such pulse cycle within the range of 3 to 1000. In other words, the ammonia plasma is introduced at least one time after the initial surface treatment and can be introduced a plurality of times within the range of 3 to 1000 cycles, at regular intervals or irregular intervals. As is shown in the experimental results below, while the pre-treatment of the substrate with ammonia plasma effected a highly selective deposition of silicon nitride, this selectivity began to dissipate after achieving a silicon nitride film thickness of about 10 nm (100 Å). Advantageously, treatment with ammonia plasma after each 200 cycles (in the ALD example herein), greatly improved selectivity.

In the practice of the invention, suitable temperatures are about 150° C. to about 400° C., and pressures are below about 15 Torr. In other embodiments, the temperature is from about 175° C. to about 350° C., or about 200° C. to about 250° C. Selective deposition is achieved when the silicon nitride film deposits on some of the exposed surfaces at some manufacturable rate and other surfaces receive an amount of silicon nitride that is negligible or easily removed.

In certain embodiments, one of the microelectronic device surfaces upon which silicon nitride deposition is desired (i.e., a "first" surface) will comprise a silicon nitride surface. In other embodiments, such first surface is chosen from oxides such as silicon dioxide, germanium oxide, SiOC, SiOF, silicon carbide, silicon oxynitride, and low-k substrates. In some embodiments, the dielectric is a porous material. In some embodiments, the porous dielectric contains pores which are connected to each other, while in other embodiments the pores are not connected to each other. In some embodiments, the dielectric comprises a low-k material, defined as an insulator with a dielectric value below about 4.0. In some embodiments, the dielectric value of the low-k material is below about 3.5, below about 3.0, below about 2.5 or below about 2.3. In some embodiments, the first surface comprises Si—O bonds.

In certain embodiments, the microelectronic device will also possess substrates or surfaces on which the deposition of silicon nitride is not desired (i.e., a "second" surface). In one embodiment, this second surface is aluminum oxide. In other embodiments, this second surface is chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and combinations thereof.

In certain embodiments, the device substrate is comprised of at least one silicon dioxide surface and at least one aluminum oxide surface, whereby the silicon nitride is selectively deposited on the aluminum oxide surface.

In certain embodiments, the device substrate is comprised of at least one silicon dioxide surface and at least one zirconium dioxide surface, whereby the silicon nitride is selectively deposited on the at least one zirconium dioxide surface.

In certain embodiments, the device substrate is comprised of at least one silicon dioxide surface and at least one aluminum oxide surface, the device surfaces are pre-treated with ammonia plasma, followed by periodic treatment with ammonia plasma as set forth herein, and whereby the silicon nitride is selectively deposited on the at least one silicon dioxide surface.

In certain embodiments, the device substrate is comprised of at least one silicon dioxide surface and at least one hafnium oxide surface, the device surfaces are pre-treated with ammonia plasma, and whereby the silicon nitride is selectively deposited on the at least one silicon dioxide surface; followed by periodic treatment with ammonia plasma as described herein.

In certain embodiments, the device substrate is comprised of at least one silicon dioxide surface and at least one zirconium dioxide surface, the device surfaces are pre-treated with ammonia plasma, and whereby the silicon nitride is selectively deposited on the at least one silicon dioxide surface; followed by periodic treatment with ammonia plasma as described herein.

In such embodiments, the term "selectively depositing" or "selectivity" is intended to reflect a preferential deposition of silicon nitride on one surface over another. A numerical definition has been given by Gladfelter [Chem. Mater. 5, 1372 (1993)] as the difference in coverage between two surfaces normalized to the sum of the coverage of the same two surfaces. In practice, the selectivity of processes is generally dependent upon the thickness of the film. This invention enables selectivity of greater than about 89% at 97 Å in thickness. In other embodiments, preferential deposition of silicon nitride on one surface over another surface occurs at an incidence of greater than 99% at over 190 Å in thickness.

This methodology utilizes uses silicon tetraiodide ($SiI_4$) or disilicon hexaiodide ($Si_2I_6$) as one "silicon" precursor, and uses a nitrogen-containing material as a co-reactant or as another precursor. The nitrogen-containing material may be organic (for example, t-butyl hydrazine, methyl hydrazine, 1,1-dimethyl hydrazine, 1,2-dimethyl hydrazine, alkylamine, or pyridine), or inorganic (for example, ammonia or hydrazine). In some embodiments, a mixture of nitrogen-containing materials may be utilized as precursor for the ALD, and in other embodiments only one nitrogen-containing material may be utilized as precursor for the ALD (for example, only ammonia, or only t-butyl hydrazine). As used herein, the term "a nitrogen-containing material" may be utilized to refer to a precursor material which is pure (for instance, which is entirely ammonia or entirely t-butyl hydrazine), or may refer to a precursor which contains "a nitrogen-containing material" as part of a mixture of nitrogen-containing materials. In certain embodiments, the vapor deposition of the invention may be used to form material comprising silicon and nitrogen. Such material may comprise, consist essentially of, or consist of silicon nitride, and/or may have other components.

In one embodiment, by the pre-treating of microelectronic devices having surfaces or substrates of differing compositions by ammonia plasma, followed by periodic introduction of ammonia plasma after a chosen number of cycles or pulses, about 0.3 to about 5.0 nanometers of silicon nitride via silicon tetraiodide and a nitrogen compound such as ammonia can be selectively deposited on a silicon dioxide surface, while no or limited deposition is achieved on some metal oxide surfaces (e.g., $Al_2O_3$, $HfO_2$, and $ZrO_2$)

In atomic layer deposition, sequential processing steps are generally referred to as "pulses" or cycles. As such, ALD processes are based on controlled, self-limiting surface reactions of precursor chemicals. This invention can be practiced with either fully saturated reactions, or, if more manufacturable, merely separate pulses of the precursor and co-reactant. Gas phase reactions are substantially avoided by alternately and sequentially contacting the substrate with the precursors. This can be practiced by moving the substrate from regions of different reactants and co-reactants or by alternating the gas flows over a stationary substrate. In both cases, vapor phase reactants are separated from each other in time and on the substrate surface, for example, by removing excess reactants and/or reactant by-products from the reaction chamber between reactant pulses. In some embodiments, one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate comprising at least a first surface and second, different surface is heated to a suitable deposition temperature ranging from 150° C. to 400° C., generally at lowered pressure of from about 0.5 to less than 15 torr. In other embodiments, the temperature is from about 175° C. to 350° C. or 200° C. to 250° C. Deposition temperatures are generally maintained below the thermal decomposition temperature of the reactants but at a high enough temperature to avoid condensation of reactants and to provide the activation energy for the desired "selective" surface reactions.

The surface of the substrate is contacted with a vapor phase first reactant. In certain embodiments, a pulse of vapor phase first reactant is provided to a reaction space containing the substrate. In other embodiments, the substrate is moved to a reaction space containing vapor phase first reactant. Conditions are generally selected such that no more than about one monolayer of the first reactant is adsorbed on the substrate surface in a self-limiting manner. The appropriate contacting times can be readily determined by the skilled artisan based on the particular conditions, substrates and reactor configurations. Excess first reactant and reaction by-products, if any, are removed from the substrate surface, such as by purging with an inert gas or by removing the substrate from the presence of the first reactant.

Purging means that vapor phase precursors and/or vapor phase by-products are removed from the substrate surface such as by evacuating a chamber with a vacuum pump and/or by replacing the gas inside a reactor with an inert gas such as argon or nitrogen. In certain embodiments, purging times are from about 0.05 to 20 seconds, between about 1 and 10, or between about 1 and 3 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In certain embodiments, a pulse of a second gaseous reactant is provided to a reaction space containing the substrate. In other embodiments, the substrate is moved to a reaction space containing the vapor phase second reactant. Excess second reactant and gaseous by-products of the surface reaction, if any, are removed from the substrate surface. The steps of contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

Each phase of each cycle is generally self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In certain embodiments, purging can comprise turning off the flow of the reactive gas while continuing to flow an inert carrier gas to the reaction space. In another embodiment, the purge step may employ a vacuum step to remove excess reactant from the surface.

With regard to the ammonia plasma, the process may comprise a direct plasma-generated process in which plasma is directly generated in the reactor, or alternatively, a remote plasma-generated process in which plasma is generated 'remotely' of the reaction zone and substrate, being supplied into the reactor. In this regard, energy sources such as radio frequency (RF) sources can provide power to the deposition chamber sufficient to ionize the ammonia gas, that is introduced as a pre-treatment step, and thereafter periodically. In the step of treating with ammonia plasma, the power applied is greater than 200 W, and in certain embodiments greater than about 250 W, greater than about 275 W, greater than about 300 W, greater than about 325 W, or even greater than about 350 W. For example, the power applied can be in the range of about 250 to about 500 W, in the range of about 300 to about 475 W, in the range of about 350 to about 450 W, or in the range of about 375 to about 425 W. During the step of ammonia plasma treatment, the power applied can optionally vary, such as by increasing the power over the treatment period.

Exemplary flow rates of the ammonia plasma are at least 50 sccm, at least about 100 sccm, at least about 150 sccm, or at least about 175 sccm. In more specific aspects the flow rate of the reducing gas is in the range of about 100 to about 400 sccm, in the range of about 150 to about 300 sccm, or in the range of about 175 to about 275 sccm. The amount of ammonia plasma flowed into the chamber may optionally be expressed in terms of the amount of ammonia plasma to total gas (ammonia plasma and inert gas) flowed into the chamber during the ammonia plasma treatment step. For example, the amount of ammonia plasma can be in the range of about 10% to about 50%, about 15% to about 40%, or about 20% to about 35% of the total amount of gas flowed into the chamber during the ammonia plasma treatment step.

Reactors capable of being used in the process of the invention include ALD reactors, as well as CVD reactors equipped with appropriate equipment and means for providing the reactants in a "pulsed" manner. According to certain embodiments, a showerhead reactor may be used. Examples of suitable reactors that may be used include commercially available equipment, as well as home-built reactors, and will be known to those skilled in the art of CVD and/or ALD.

As used herein, the term "microelectronic device" corresponds to semiconductor substrates, including 3D NAND structures, logic devices, DRAM, power devices, flat panel displays, and microelectromechanical systems (MEMS), manufactured for use in microelectronic, integrated circuit, or computer chip applications. It is to be understood that the term "microelectronic device" is not meant to be limiting in any way.

Insofar as the process of the invention enables the highly selective deposition of silicon nitride, the resulting microelectronic device substrates are thus advantaged by having minimal silicon nitride deposited on undesired surfaces. Accordingly, in a further aspect, the invention provides a microelectronic device having a plurality of surfaces of differing composition, wherein the device comprises at least one first surface comprising at least one surface chosen from silicon nitride, silicon dioxide, germanium oxide, SiCO, SiC, SiON, SiOF, and low-k substrates, and one surface comprising at least one second surface chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, and strontium oxide.

In one embodiment, the invention provides a microelectronic device having a plurality of surfaces of differing composition, wherein the device comprises at least one first surface comprising at least one surface chosen from silicon nitride, silicon dioxide, germanium oxide, SiCO, SiC, SiON, SiOF, and low-k substrates, and one surface comprising at least one second surface chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and wherein the first surface has deposited thereon a silicon nitride film having a thickness of at least 200 Å, and wherein the second surface has deposited thereon a silicon nitride film having a thickness of no more than about 3 Å.

In another embodiment, the invention provides a microelectronic device having a plurality of surfaces of differing composition, wherein the device comprises at least one surface comprising silicon dioxide, and at least one surface comprising aluminum oxide, and wherein the surface comprising silicon dioxide has deposited thereon a silicon nitride film having a thickness of at least 200 Å, and wherein the surface comprising aluminum oxide has deposited thereon a silicon nitride film having a thickness of no more than about 3 Å.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1

In this example, silicon nitride was selectively deposited on the first surface of substrate relative to a second, third, and fourth, different surfaces of the substrate. The first surface of the substrate comprised native silicon oxide. The second surface of the substrate comprised $Al_2O_3$ deposited by ALD. The third surface of the substrate comprised $HfO_2$ deposited by ALD. The fourth surface of the substrate comprised $ZrO_2$ deposited by ALD. Prior to silicon nitride deposition, the substrate was subjected to an ammonia plasma treatment process.

The silicon nitride film was selectively deposited by an ALD process using silicon tetraiodide ($SiI_4$) as a first precursor and ammonia as a second precursor. Silicon tetraiodide was contained in a ProE-Vap ampoule and heated to 100° C. $N_2$ carrier gas flowed over the surface of solid silicon tetraiodide carrying silicon tetraiodide vapor into heated chamber with the substrate at a temperature of 200° C. and a reaction chamber pressure of 1.5 Torr. Each deposition cycle included a silicon tetraiodide vapor pulse of 10 seconds, an inert $N_2$ purge for 3 seconds, an ammonia pulse of 10 seconds and an inert $N_2$ purge for 3 seconds. Referring to FIG. 1, samples were deposited using an ALD process consisting of from 100 to 600 deposition cycles, the thickness of material deposited on the first plasma treated native silicon oxide surface was measured and compared with the thickness of material deposited on the second, third and fourth plasma treated $Al_2O_3$, $HfO_2$, and $ZrO_2$ surfaces. FIG. 1 shows that silicon nitride deposition on the plasma treated native silicon oxide surface had very high selectivity relative to the plasma treated $Al_2O_3$ surface up to 400 cycles. (Selectivity is over 95%). However, plasma treated $HfO_2$ and $ZrO_2$ surfaces showed the same selectivity of 95% only up to 300 cycles.

Example 2

Figure 2:
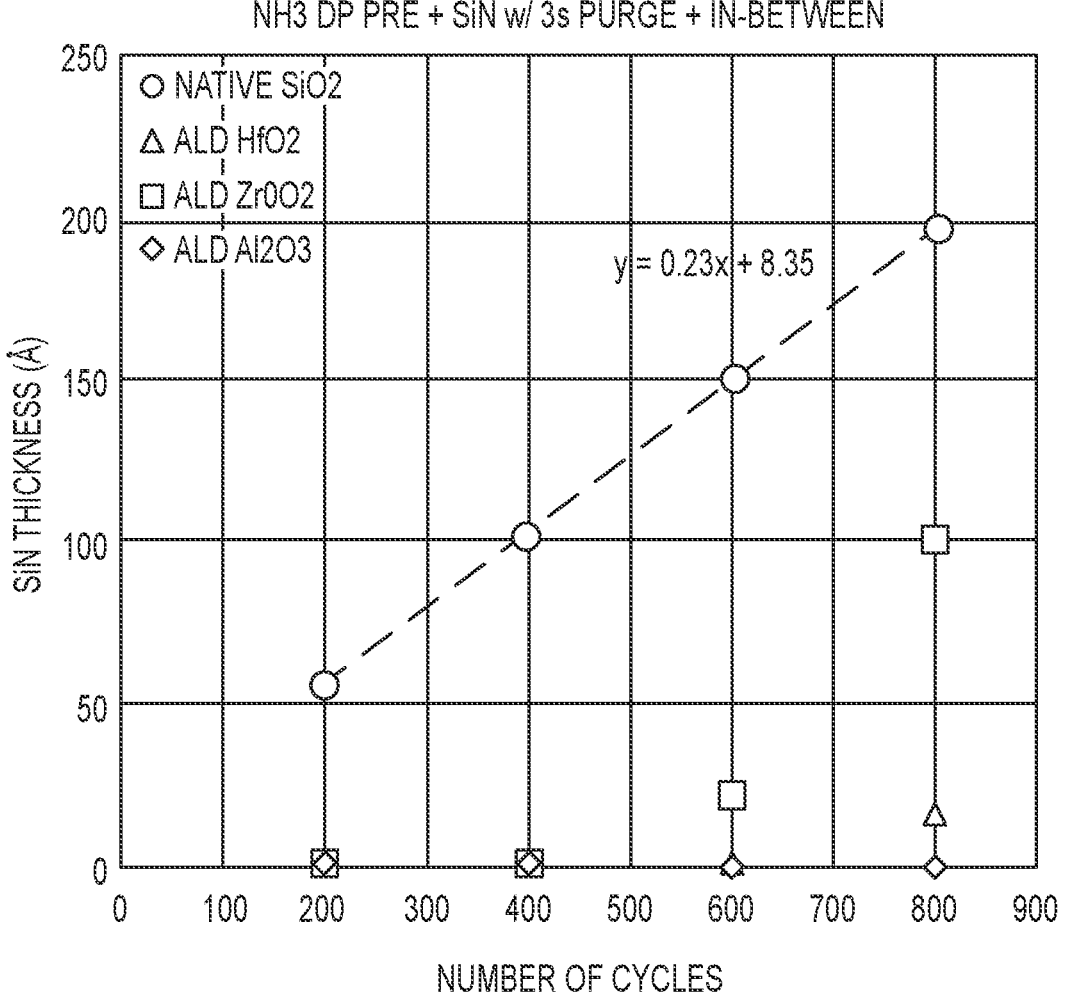
FIG. 2 shows the result achieved by an embodiment of the present invention where silicon tetraiodide/ammonia ALD is conducted while adding steps of direct ammonia plasma after each campaign of 200 cycles of silicon tetraiodide/ammonia atomic layer deposition (silicon tetraiodide/ammonia ALD). In other words, in this process, ammonia direct plasma is applied, followed by 200 cycles of silicon tetraiodide/ammonia ALD, followed by reapplication of ammonia direct plasma, followed by 200 cycles of silicon tetraiodide/ammonia ALD, etc.
Figure 3:
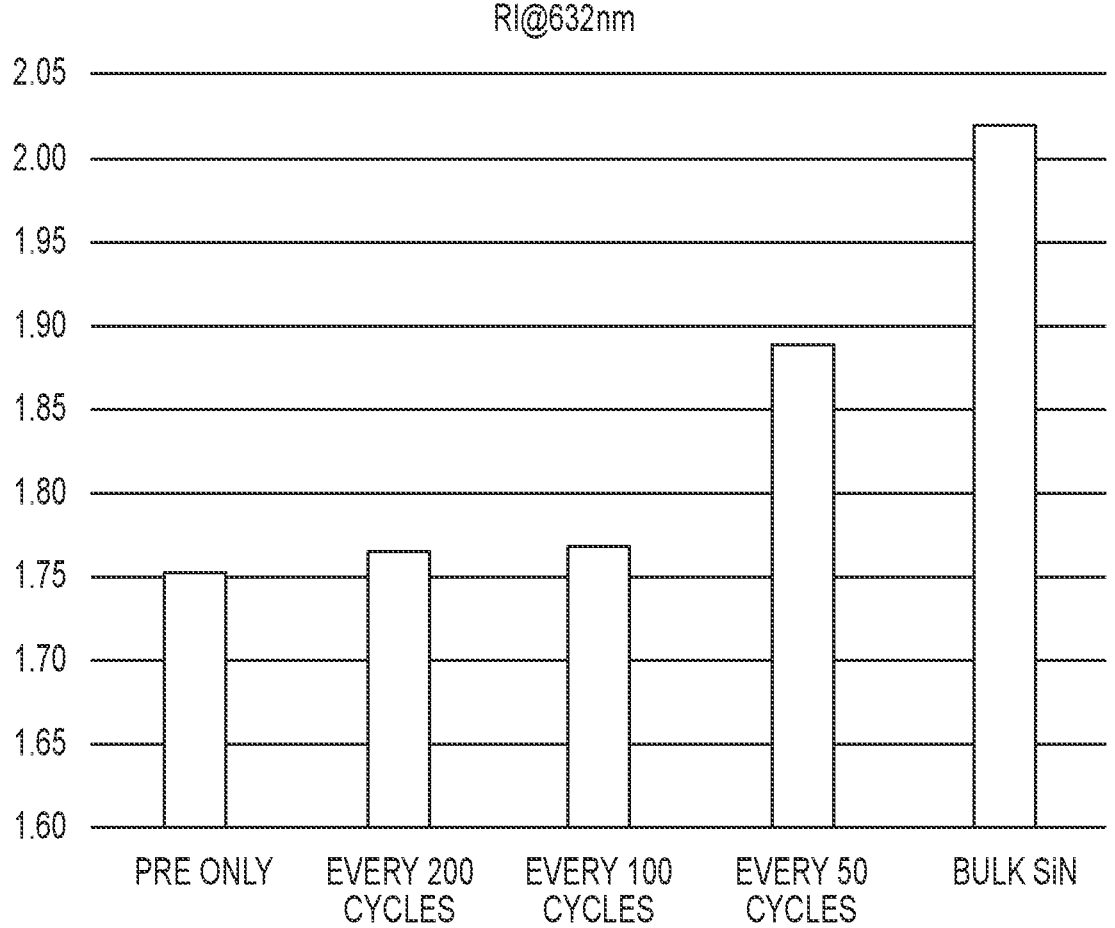
FIG. 3 illustrates concomitant improvement in refractive index of the deposited silicon nitride using varying junctures for reapplying ammonia direct plasma to the substrate in the reaction zone.
Figure 4A:
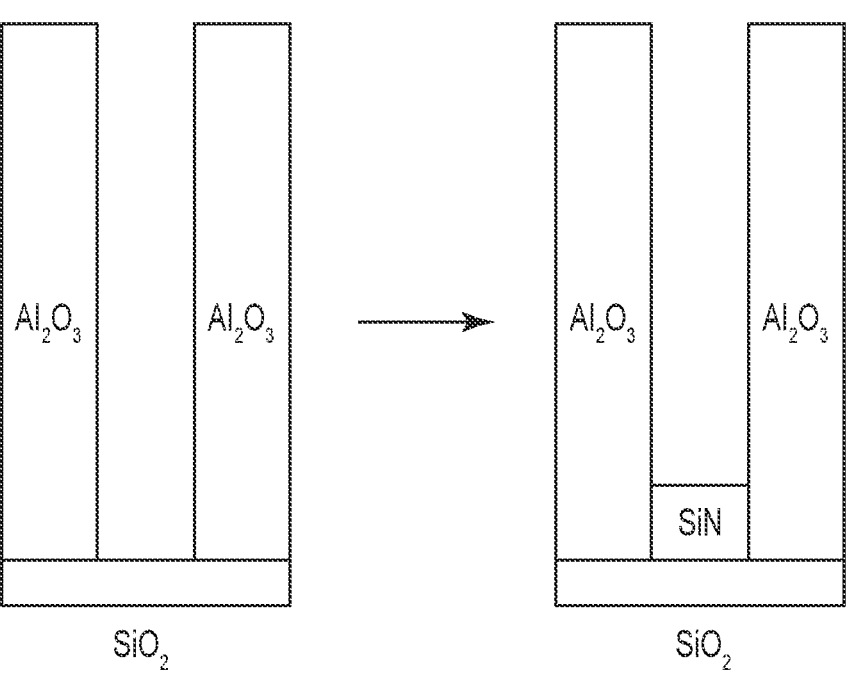
FIGS. 4a and 4b, illustrate the practical challenges faced when a selective deposition of silicon nitride is desired.
Figure 4B:
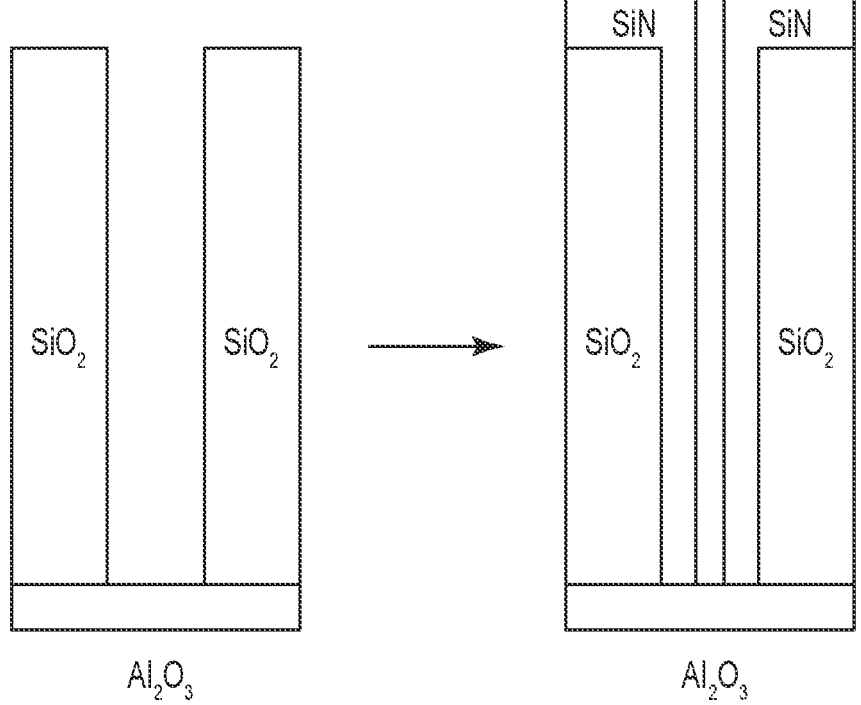

In this example, silicon nitride was selectively deposited on the first surface of substrate relative to a second, third, and fourth, different surfaces of the substrate. The first surface of the substrate comprised native silicon oxide. The second surface of the substrate comprised $Al_2O_3$ deposited by ALD. The third surface of the substrate comprised $HfO_2$ deposited by ALD. The fourth surface of the substrate comprised $ZrO_2$ deposited by ALD. Prior to silicon nitride deposition, the substrate was subjected to an ammonia plasma treatment process. After every 200 deposition cycles, the ammonia plasma treatment process was reapplied to all surfaces of the substrate. Referring to FIG. 2, samples were deposited using an ALD process consisting of from 200 to 800 deposition cycles, the thickness of material deposited on the first plasma treated native silicon oxide surface was measured and compared with the thickness of material deposited on the second, third and fourth plasma treated $Al_2O_3$, $HfO_2$, and $ZrO_2$ surfaces. FIG. 2 shows that silicon nitride deposition on the plasma treated native silicon oxide surface had very high selectivity relative to the plasma treated $Al_2O_3$ surface up to 800 cycles. (Selectivity is over 95%). However, plasma treated $HfO_2$ and $ZrO_2$ surfaces showed the same selectivity of 95% only up to 600 and 400 cycles, respectively. By comparing FIG. 1 and FIG. 2, reapplying ammonia plasma treatment process greatly enhances the selectivity between native silicon oxide and all other three surfaces.

Example 3

In this example, refractive index (RI) of silicon nitride deposited using methods discussed in Examples 1 and 2 was measured using spectroscopic ellipsometry. Different ammonia plasma treatment reapplying frequencies were varied from every 200 cycles to every 50 cycles. By comparing with RIs of no reapplying and bulk silicon nitride films, reapplying every 50 cycles greatly enhanced RI of silicon nitride films deposited.

ASPECTS

In a first aspect, the invention provides a process for depositing a silicon nitride film on a microelectronic device substrate having a plurality of surfaces of differing composition, which comprises
    a. contacting the substrate with pulsed silicon tetraiodide or disilicon hexaiodide, and nitrogen-containing co-reactants, at a temperature of about 150° C. to about 400° C., at a pressure below about 15 Torr, under vapor deposition conditions, thereby defining a pulse cycle, and
    b. wherein the substrate is (i) pre-treated with ammonia plasma, and wherein (ii) the substrate is further treated with ammonia plasma periodically thereafter.

In a second aspect, the invention provides the process of the first aspect, wherein the substrate is further treated at least one time with ammonium plasma in the range of after every 10 to after every 1000 pulse cycles.

In a third aspect, the invention provides the process of the first or second aspect, wherein the substrate is further treated with ammonia plasma after every 15 pulse cycles.

In a fourth aspect, the invention provides the process of the first or second aspect, wherein the substrate is further treated with ammonia plasma after every 20 pulse cycles.

In a fifth aspect, the invention provides the process of the first or second aspect, wherein the substrate is further treated with ammonia plasma after every 25 pulse cycles.

In a sixth aspect, the invention provides the process of the first or second aspect, wherein the substrate is further treated with ammonia plasma after every 30 pulse cycles.

In a seventh aspect, the invention provides the process of the first or second aspect, wherein the substrate is further treated with ammonia plasma after every 35 pulse cycles.

In an eighth aspect, the invention provides the process of the first or second aspect, wherein the substrate is further treated with ammonia plasma after every 40 pulse cycles.

In a ninth aspect, the invention provides the process of the first or second aspect, wherein the substrate is further treated with ammonia plasma after every 45 pulse cycles.

In a tenth aspect, the invention provides the process of the first or second aspect, wherein the substrate is further treated at least one time with ammonia plasma in the range of after every 50 to every 200 pulse cycles.

In an eleventh aspect, the invention provides the process of any of the first through the tenth aspects, wherein silicon nitride is deposited onto surfaces chosen from silicon nitride, silicon dioxide, germanium oxide, SiCO, SiC, SiON, SiOF, and low-k substrates.

In a twelfth aspect, the invention provides the process of any one of the first through the tenth aspects, wherein the silicon nitride film is deposited onto surfaces chosen silicon nitride, silicon dioxide, germanium oxide, SiCO, SiC, SiON, SiOF, and low-k substrates over deposition onto surfaces chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and combinations thereof, at a selectivity of about 85 to about 99%.

In a thirteenth aspect, the invention provides the process of any one of the first through the tenth aspects, wherein the device substrate comprises at least one surface comprised of silicon dioxide and at least one surface comprising aluminum oxide, and wherein the process results in preferential deposition of silicon nitride on the silicon dioxide at a selectivity of about 99% in a silicon nitride film deposited on the silicon dioxide surface and wherein the silicon nitride film has an approximate thickness of 200 Å.

In a fourteenth aspect, the invention provides the process of any one of the first through the tenth aspects, wherein the device substrate comprises at least one surface comprised of silicon dioxide and at least one surface comprising aluminum oxide, and wherein the process results in preferential deposition of silicon nitride on the silicon dioxide at a selectivity of about 99% in a silicon nitride film deposited on the silicon dioxide surface and wherein the silicon nitride film has an approximate thickness of at least 50 Å.

In a fourteenth aspect, the invention provides a microelectronic device having a plurality of surfaces of differing composition, wherein the device comprises at least one first surface comprising at least one surface chosen from silicon nitride, silicon dioxide, germanium oxide, SiCO, SiC, SiON, SiOF, and low-k substrates, and one surface comprising at least one second surface chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and wherein the first surface has deposited thereon a silicon nitride film having a thickness of about 200 Å, and wherein the second surface has deposited thereon a silicon nitride film having a thickness of no more than about 3 Å.

In a fifteenth aspect, the invention provides a microelectronic device having a plurality of surfaces of differing composition, wherein the device comprises at least one surface comprising silicon dioxide, and at least one surface comprising aluminum oxide, and wherein the surface comprising silicon dioxide has deposited thereon a silicon nitride film having a thickness of about 200 Å, and wherein the surface comprising aluminum oxide has deposited thereon a silicon nitride film having a thickness of no more than about 3 Å.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:
    1. A process for depositing a silicon nitride film on a microelectronic device substrate having a plurality of surfaces of differing composition, which comprises
        a. contacting the substrate with pulsed silicon tetraiodide or disilicon hexaiodide, and nitrogen-containing co- reactants, at a temperature of about 150° C. to about 400° C., at a pressure below about 15 Torr, under vapor deposition conditions, thereby defining a pulse cycle, and b. wherein the substrate is (i) pre-treated with ammonia plasma, and wherein (ii) the substrate is further treated with ammonia plasma periodically between sets of pulse cycles.

2. The process of claim 1, wherein the substrate is further treated at least one time with ammonia plasma in the range of after every 10 to after every 1000 pulse cycles.

3. The process of claim 1, wherein the substrate is further treated with ammonia plasma after every 15 pulse cycles.

4. The process of claim 1, wherein the substrate is further treated with ammonia plasma after every 20 pulse cycles.

5. The process of claim 1, wherein the substrate is further treated with ammonia plasma after every 25 pulse cycles.

6. The process of claim 1, wherein the substrate is further treated with ammonia plasma after every 30 pulse cycles.

7. The process of claim 1, wherein the substrate is further treated with ammonia plasma after every 35 pulse cycles.

8. The process of claim 1, wherein the substrate is further treated with ammonia plasma after every 40 pulse cycles.

9. The process of claim 1, wherein the substrate is further treated with ammonia plasma after every 45 pulse cycles.

10. The process of claim 1, wherein the substrate is further treated at least one time with ammonia plasma in the range of after every 50 to every 200 pulse cycles.

11. The process of claim 1, wherein silicon nitride is deposited onto surfaces chosen from silicon nitride, silicon dioxide, germanium oxide, SiCO, SiC, SiON, SiOF, and low-k substrates.

12. The process of claim 1, wherein the silicon nitride film is deposited onto surfaces chosen silicon nitride, silicon dioxide, germanium oxide, SiCO, SiC, SiON, SiOF, and low-k substrates over deposition onto surfaces chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and combinations thereof, at a selectivity of greater than about 85%.

13. The process of claim 1, wherein the device substrate comprises at least one surface comprised of silicon dioxide and at least one surface comprising aluminum oxide, and wherein the process results in preferential deposition of silicon nitride on the silicon dioxide at a selectivity of about 99% in a silicon nitride film deposited on the silicon dioxide surface and wherein the silicon nitride film has a thickness of at least about 200 Å.

14. The process of claim 1, wherein the device substrate comprises at least one surface comprised of silicon dioxide and at least one surface comprising aluminum oxide, and wherein the process results in preferential deposition of silicon nitride on the silicon dioxide at a selectivity of about 99% in a silicon nitride film deposited on the silicon dioxide surface and wherein the silicon nitride film has a thickness of at least about 50 Å.

15. The process of claim 1, wherein the process comprises at least three ammonia plasma treatments.

16. The process of claim 1, wherein the process produces silicon nitride films with improved refractive index compared to processes with the same precursor and deposition conditions which lack the periodic ammonia plasma treatments.

17. A microelectronic device having a plurality of surfaces of differing composition, wherein the device comprises at least one first surface comprising at least one surface chosen from silicon nitride, silicon dioxide, germanium oxide, SiCO, SiC, SiON, SiOF, and low-k substrates, and one surface comprising at least one second surface chosen from titanium nitride, tantalum nitride, aluminum nitride, hafnium oxide, zirconium oxide, aluminum oxide, titanium oxide, tantalum oxide, niobium oxide, lanthanum oxide, yttrium oxide, magnesium oxide, calcium oxide, strontium oxide, and wherein the first surface has deposited thereon a silicon nitride film having a thickness of at least 200 Å, and wherein the second surface has deposited thereon a silicon nitride film having a thickness of no more than about 3 Å.

18. A microelectronic device having a plurality of surfaces of differing composition, wherein the device comprises at least one surface comprising silicon dioxide, and at least one surface comprising aluminum oxide, and wherein the surface comprising silicon dioxide has deposited thereon a silicon nitride film having a thickness of at least 200 Å, and wherein the surface comprising aluminum oxide has deposited thereon a silicon nitride film having a thickness of no more than about 3 Å.

19. A process for selectively depositing a silicon nitride film on a microelectronic device substrate having a plurality of surfaces of differing composition, which comprises:

treating the device with an ammonia plasma;
    repeatedly contacting the device with pulsed silicon tetraiodide or disilicon hexaiodide, and nitrogen-containing co-reactants, at a temperature of about 150° C. to about 400° C., at a pressure below about 15 Torr, under vapor deposition conditions; and
    repeating the above steps for multiple cycles until a desired thickness of the silicon nitride film is formed.

* * * * *